United States Patent [19]
Toeg

[11] Patent Number: 4,864,282
[45] Date of Patent: Sep. 5, 1989

[54] METHOD AND APPARATUS FOR DETECTING OR MEASURING THE PRESENCE OF HUMANS OR BIOLOGICAL ORGANISM

[76] Inventor: Sasson Toeg, 9378 W. Olympic Blvd., Beverly Hills, Calif. 90212

[21] Appl. No.: 921,327

[22] Filed: Oct. 21, 1986

[51] Int. Cl.⁴ .................................. G08B 13/22
[52] U.S. Cl. .................... 340/573; 128/639; 128/734; 340/541
[58] Field of Search ............... 340/573, 541; 128/639, 128/734

[56] References Cited

U.S. PATENT DOCUMENTS

| | | | |
|---|---|---|---|
| 4,300,574 | 11/1981 | Briggs | 128/734 |
| 4,459,995 | 7/1984 | Conners et al. | 128/734 |
| 4,557,271 | 12/1985 | Stoller et al. | 128/734 |
| 4,574,810 | 3/1986 | Lerman | 128/419 D |
| 4,578,634 | 3/1986 | Mee et al. | 324/62 |
| 4,602,639 | 7/1986 | Hoogendoorn et al. | 128/639 |
| 4,727,330 | 2/1988 | Funk | 128/734 |

Primary Examiner—Glen R. Swann, III
Attorney, Agent, or Firm—David O'Reilly

[57] ABSTRACT

A method and apparatus for detecting the presence of an object, such as a biological organism, particularly that of a human. Changes occuring upon occupation of a unoccupied spacial location are sensed and analyzed to produce a display, or otherwise used to control other devices. The apparatus includes an antennae to detect electromagnetic radiation changes caused by an organism coming into contact with the antennae or in a spacial area in proximity of the antennae. The changes detected by the antennae are coupled through a receiver to a bridge network for analysis. The circuitry of the bridge network compares the changes caused by the detected object to a zero reference. An output from the bridge is applied to a process which compares all signals with a vector preset in the process. Amplitude and phase are compared with known characteristics for the presence of a human body. The process or output can then be used to indicate the presence of a human by a display device or to trigger alarm devices or for other purposes.

10 Claims, 2 Drawing Sheets

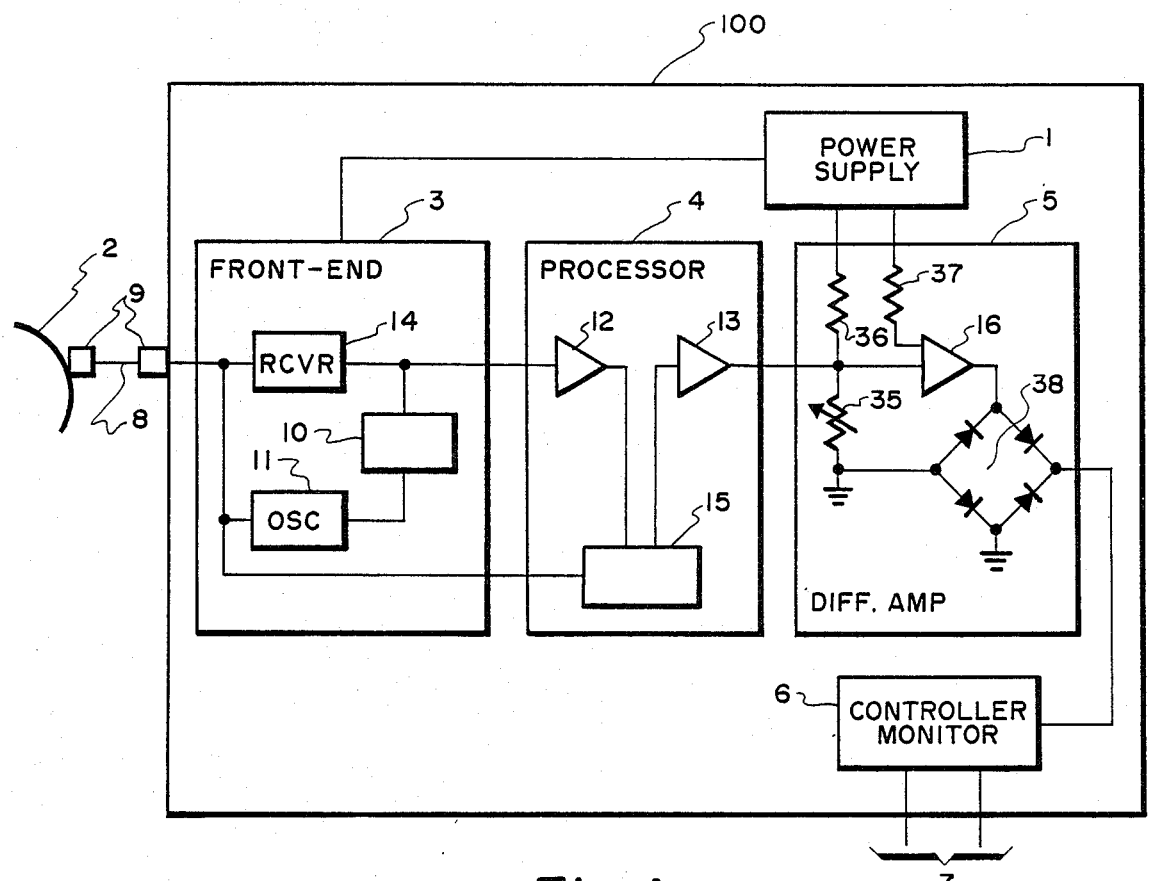
Fig. 1.
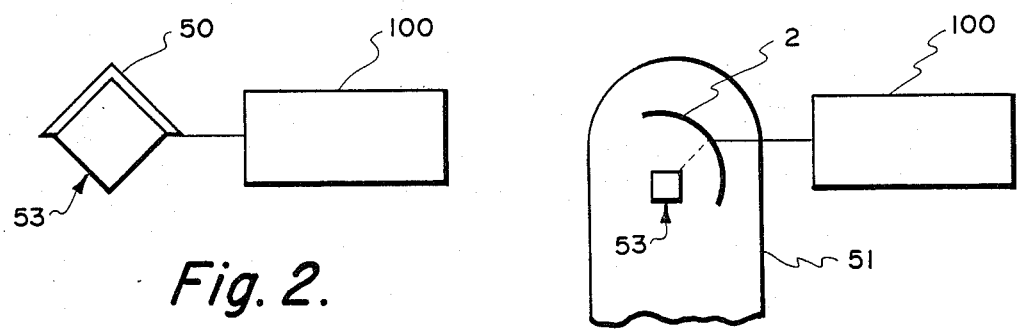
Fig. 2.
Fig. 3.

METHOD AND APPARATUS FOR DETECTING OR MEASURING THE PRESENCE OF HUMANS OR BIOLOGICAL ORGANISM

FIELD OF THE INVENTION

This invention relates to methods and apparatus for detecting the presence of an object, and more particularly relates to a method or apparatus for detecting the presence of biological organisms, particularly humans;

BACKGROUND OF THE INVENTION

This invention relates to a method and apparatus for measuring charged ion concentrations of biological organisms, particularly, in humans.

It is known that a large number of hydrogen atoms are present in bio-organic compounds. Normal blood plasma consists of protein, salt, water, albumin, sugar and urea, having hydrogen (H+) ion concentration of approximately $0.4 \times 10^{-7}$ gr/liter. This corresponds to a pH equal to 7.4. The blood is highly buffered due to its interaction with sodium bicarbonate, thus, yielding a narrow pH range that is typically characteristic of humans.

Measurement of resistance or conductivity can be made by various means by which electrical fields are induced and vectorially measured to determine their magnitude. Presently, there are a number of such devices but none can truly distinguish between ground current loops, variation in capacitance and a living organism.

This application disclosed an improvement in the method of detection of conductive bodies specifically directed toward a specified range of measurement, comparable to pH of 7.1 to 7.8. In comparisonpresent state of the art devices, sensors are used for detecting metal objects comprised of an oscillator, coils and a balancingelectronic bridge which nulls a signal in the absence of metal.

A more sophisticated system provides orthogonal signals in a phase correlated configuration that allows discrimination of various metals and/or ranges of conductivities. These devices when applied for human detection do not work or are inaccurate, have a high range of failure and are quite expensive. Similar to the above are those systems that necessitate radioactive substances for ionization paths between the organism and the apparatus.

The desirability of contact or contactless systems for detecting and measuring the pH in biological organisms is recognized. Nuclear Magnetic Resonance Imaging in Medicine, Leon Kaufman, et. al., IGAKO-SHOIN, Publication, N.Y. (1944).; NMR Imaging in Biomedicine, Supplement 2, P. Manfield, et. al., Academic Press (1982). From the publications it is clear that such measurements are accomplished by measuring the phosphorus nuclei, a difficult and expensiveprocess. Patents related to such systems are Hoogendoorn, et. al., U.S. Pat. No. 4,602,639 issued June, 1986; Mee, et al. U.S. Pat. No. 4,578,635, issued March, 1986; Lerman, U.S. Pat. No. 4,574,810, issued March, 1986; Stoller, et. al., U.S. Pat. No. 4,557,271, issued December, 1985; Atlas, U.S. Pat. No. 4,540,002, issued September, 1985; Conners, et. al., U.S. Pat. No. 4,459,995, issued July, 1984; Briggs, U.S. Pat. No. 4,300,574, issued November, 1981. Of these patents the most pertinent is Hoogendoorn, et. al. which deals primarily with capacitive measurements, while all the other patents cited deal with a basic resistance measuring in Ohn factors in a living body. The present invention proposes substantial improvements in such devices than those disclosed in the cited patents.

SUMMARY OF THE INVENTION

The present invention provides an apparatus comprised of an oscillator having a special wave-form, frequency and bandwidth, detection measuring circuitry and antenna design for a typical application. The invention is based on the concept in vivo amount of blood in men (i.e. $0.413$ Height$^3 + 0.45$ Weight $- 0.03$) liters and ($0.414$ H$^3 0.032$ W $- 0.03$) liters for women, yields an average of (H+) ion concentration of $0.4 \times 10^{-7}$ gr./liter of blood. This corresponds to an average pH=7.4 and slightly varies with temperatures from 7.379 at 40° to 7.430 at 20° C.

The antenna, metal or any other conductive material, provides the electrical signal for conductivity measurements. The pH range to be detectedis determind by limiting conductivity measurements to a specified range corresponding to pH factor of humans. When the measured value is outside the desired rang, the measurement is ignored. The desired signal is amplified and directed to a monitor or a controller (such as a relay) for external use. Human detection may be accomplished by either human contact with the antenna (i.e. low power system, touch sense) or by entering the antenna radiation beams to signify presence.

To carry out the process of the present invention, a novel oscillator is provided having a special wave-form and frequency. Generally, a sine-cosine wave shape produces good quadrature signals with an acceptable level of signal-to-noise ratios for detection, but it cannot be used for this application due to the associated undesired parameters of capacitive effects, inductive current loops and, in particular, ground current loops that flow through the power supply to earth ground.

In accordance with the present invention, an entirely new wave-form is used to reduce these undesired effects and improve conductivity measurements, thus allowing measurements of smallvalues in the desired pH range.

The above and other features of this invention will be fully understood from the following detailed description and the accompanying drawings, in which:

BRIEF DESCRIPTION OF THE DRAWING

FIG. 1 is a block diagram of an apparatus constructed according to the present invention.

FIG. 2 illustrates direct human contact with a detecting antennae, according to the invention.

FIG. 3 illustrates human detection in a spatial area by a detecting antennae, according to the invention.

DETAILED DESCRIPTION OF THE INVENTION

Figure 4:
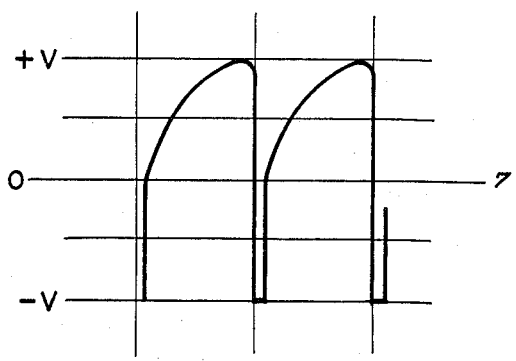
FIG. 4 is a graph illustrating voltage versus time of a typical wave-form produced by the apparatus of FIG. 1.

The present invention provides an organized system of cooperating elements arranged in an electronic circuit to measure and/or detect the conductivitiy of a living body and/or other biological organisms. For simplicity, the basic elements of apparatus 100, in functional block diagram, are depicted in FIG. 1. As shown apparatus 100 comprises antenna 2, front end block 3, power supply 1, processor 4, differential amplifier 5 and controller/monitor block 6.

The power supply 1 is a typical D.C. source, a battery or a rectified regulated A.C. supply. Antenna 2 is used for the purpose of transmitting and receiving signals. Antenna 50 of FIG. 2 is a metal surface, as an alternative configureation, which is used for human body contact, while antenna 2 of FIG. 3 is in a confining spatial location (patient examining table, classroom, hall, etc.) which couples the biological organism through the antenna to the apparatus. Antenna 2 and/or 50 may be visible or hidden and can be used in many applications. For example, a transparent electronically conductive paint or spray, applied to a wall, along rails, stairs, etc.

Figure 5:
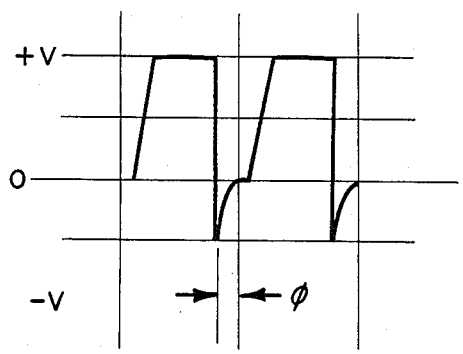
FIG. 5 is a graph illustrating phase shift and magnitude corresponding to a particular pH produced by the apparatus of FIG. 1.
Figure 6:
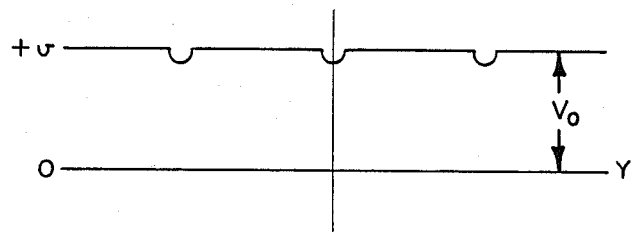
FIG. 6 is a graph of the output voltage $V_0°$ available too the controller under detection.

The oscillator 11 and the receiver 14 are the front-end compontents of block 3. The basic requirement of the oscillator used is a non-linear power-gain achievable by using a commercial FET Operational Amplifier. Frequency, bandwidth and wave-form are determined by making use of gain, the feedback loop and the power source. A typical wave-form is shown in FIG. 4, representing plus and minus voltages with respect to time. A complete cycle is shown with zero angular phase shift placed at the origin. FIG. 5 illustrates phase shift $\phi$(phi) under detection. The signal amplitude is near maximum while only small shifts result from human touch.

Figure 7:
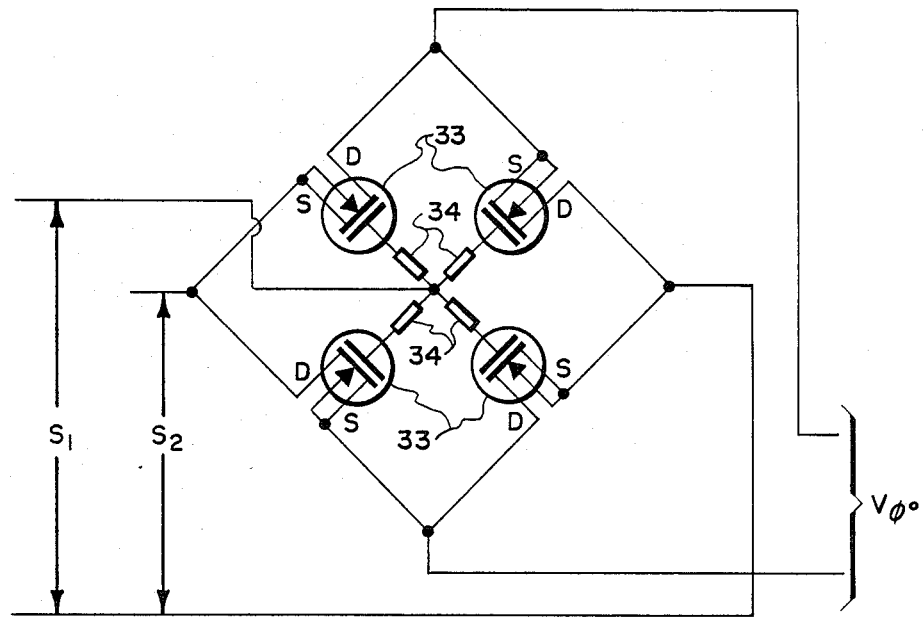
FIG. 7 is a schematic diagram of a phase correlator for making particular pH measurements possible to discriminate between objects having different conductivities.

The signal received by block 4 from block 3 has special characteristics. It is amplified linearly by amplifier circuit 12, undergoes a corrolation with a signal from oscillator 11 in a ring demodulator 15, is then logarithmically amplified by 13 to express an angular shift, while ignoring the amplitude variations. This is accomplished in the phase shift corrolator 15, which utilizes 4 MosFet devices33 to form a special ring demodulator suitable for this purpose as shown in FIG. 7. Circuit balance with respect to input and output, a factor determining the accuracy of the measurement, is obtained by fine tuning each MosFet device 33 with its gate voltage by resistors 34. Depending on the polarity of the sensed signal $S_1$ and the reference signal $S_2$, FIG. 7, an output voltage $V_0°$ represents a phase shift that is an exact corrolated signal (in phase with only a portion of the reference signal) and is independent of signal amplitude. This phase shift truly represents the induction moment, a vector with amplitude and phase compontents, as a function of the type of material under measurement.

For a selected pH range of measurement, the signal following the processor, is directed toward block 5 that contains a conventional differential amplifier and a rectifier bridge6. The gain of the amplifier 16 is set by resistor 35 and the detection range by resistors 36 and 37. The apparatus is set to compare the highest differential voltage value to those values set by resistors 36 and 37. This circuit resembles a resistive hysteresis amplifier that allows signals to pass through, as long as they are within the hysteresis value, to the bridge rectifier 6 and the controller/monitor 7. By this method, a pH range value is chosen for calibration. Terminals 8 are the external connection for a computer, an alarm system, lights, etc. By the method used in this invention, sensitivity of $10^{-6}$ to $10^{-14}$ amperes at 60° C. has been shown to be practical, achievable and suitable for the purpose of measuring the pH range and detecting bioorganisms, specifically humans.

While there has been shown and described what is presently considered a preferred embodiment of the invention, it is obvious to those skilled in the art, that various changes and modifications may be made therein, without departing from the scope of the invention as defined by the following claims.

What is claimed is:

1. An apparatus for detecting the presence of a human in a predetermined space comprising;
    antenna detecting means constructed of conductive material for detecting a change in electrical energy in said predetermined space;
    oscillator means constructed to generate a wave-form having a bandwidth and frequency selected to represent the conductivity of a human body having a known pH value;
    a differential amplifier receiving an input from the oscillating means and said antenna detecting means, said differential amplifier being calabrated to respond to a conductivity range proportional to pH values of a human body;
    log-amplifying means constructed to amplify low level signal inputs in a preselected range and saturate at high level signal inputs whereby said low level signal inputs in said preselected range pass through and all higher level signals are nullified;
    whereby the presence of a human body in a particular area may be detected from said low level signals in said preselected range which pass through said detecting apparatus, indicating a conductivity proportional to the pH value of a human body.

2. The apparatus according to claim 1 in which said log amplifying means includes phase shift correlating means.

3. The apparatus according to claim 2 in which said phase shift correlating means includes a bridge network comprised of four MOSFET devices forming a ring demodulator.

4. The apparatus according to claim 1 in which said antennae detecting means is a wave receiving antenna positioned in said predetermined space.

5. The apparatus according to claim 1 in which said antenna detecting means is a contact antenna responding to contact with said human body.

6. The apparatus according to claim 5 in which said contact antenna is a conductive material applied to one or more surfaces in said predetermined space, likely to come in contact with a human body.

7. A method of detecting the presence of a biological organism in a predetermined space comprising;
    positioning an antenna detecting means in said predetermined area;
    generating a waveform having a bandwidth and frequency corresponding to an electrical characteristic of said biological organism to be detected representative of the pH value of said biological organism;
    amplifying said generated waveform and antenna detecting means output in an amplifier calibrated to detect a range including said electrical characteristic correlated to the proper pH range of the biological organism being detected;

whereby biological organisms having a predetermined electrical characteristic due to a known pH value can be detected.

8. The method according to claim 7 in which said antenna detecting means is a wave receiving antenna positioned in said predetermined space.

9. The apparatus according to claim 7 in which said antenna detecting means is a contact antenna responding to contact with said biological organism.

10. The apparatus according to claim 9 in which said contact antenna is a conductive material applied to one or more surfaces in said predetermined space likely to come into contact with a biological organism.

* * * * *